US005910754A

United States Patent [19]

Simpson et al.

[11] Patent Number: 5,910,754

[45] Date of Patent: Jun. 8, 1999

[54] REDUCED HEIGHT WAVEGUIDE TUNER FOR IMPEDANCE MATCHING

[75] Inventors: Gary R. Simpson, Fontana; Robert L. Eisenhart, Woodland Hills; Bela B. Szendrenyi; Richard J. Maury, both of Alta Loma, all of Calif.

[73] Assignee: Maury Microwave, Inc., Ontario, Calif.

[21] Appl. No.: 08/850,681

[22] Filed: May 2, 1997

[51] Int. Cl.$^6$ ................................ H03H 7/40; H01P 5/04

[52] U.S. Cl. ............................ 333/17.3; 333/232; 333/34

[58] Field of Search ................................ 333/209, 33, 34, 333/17.3, 232

[56] References Cited

U.S. PATENT DOCUMENTS

| | | | |
|---|---|---|---|
| 2,531,437 | 11/1950 | Johnson et al. | 333/34 X |
| 3,444,486 | 5/1969 | Banes et al. | 333/232 |
| 4,030,049 | 6/1977 | McQuiddy et al. | 333/33 |

OTHER PUBLICATIONS

G.L. Ragan,Ed. "Microwave Transmission Circuits", M.I.T. Radiation Laboratories Series, vol.9, pp. 456–457 & 481–500, Massachusetts: Boston Technical Publishers, Inc., 1964.

C.G. Montgomery, Ed. "Technique of Microwave Measurements", M.I.T. Radiation Laboratories Series, vol. 11, pp.478–496, New York and London: McGraw–Hill Book Company, Inc., 1947.

P.I. Somlo and J.D. Hunter, "Microwave Impedance Measurement", pp. 60–69, London, U.K.: Peter Peregrinus Ltd., 1985.

A.E. Bailey,Ed. "Reflections and Matching", Microwave Measurements, Second Edition, pp. 74–91, London, U.K.: Peter Peregrinus Ltd., 1989.

R. Drury, R.D. Pollard, and C.M. Snowden, "A 75–110 Ghz Automated Tuner with Exceptional Range and Repeatability", IEEE Microwave and Guided Wave Letters, vol. 6, No. 10, pp. 378–379, Oct. 1996.

Product Data Sheet (Jan. 1996) "Millimeter Wave Tuners" Focus Microwaves.

Product Data Sheet "75–100 GHz Programmable Tuner" Focus Microwaves Jun. 1992.

Product Data Manual, "Automated Tuner Systems", Maury Microwave Corporation, Ontario, California, Nov. 1996.

*Primary Examiner*—Robert Pascal
*Assistant Examiner*—Justin P. Bettendorf
*Attorney, Agent, or Firm*—Larry K. Roberts

[57] ABSTRACT

A slotted line tuner, also capable of operation as a fully automated tuner, to provide arbitrary termination in high frequency waveguide media for use with frequencies of interest between 1 and 1000 GHz is disclosed. The electrical tuner is adapted to match the impedance of two waveguide media, or enhance or modify the characteristic impedance of a media relative to that of another one. The tuner utilizes a non-conductive rectangular bar vane made out of low loss, low dielectric constant material as the probe, with special gold plated areas, that is inserted through the slot of the line into a reduced height waveguide. The position and depth of this gradual probe penetration creates a continuously variable tuning of the complex impedance, ranging from a very low reflection state up to high reflection states together with an unlimited capability of phase change in its reflection. The non-conductive probe structure assures that the propagation of the coaxial guided wave modes, and especially the coaxial TEM mode, within the slot area are suppressed, thus eliminating a typical source of leakage. A series of slots is formed in the waveguide housing perpendicular to the main slotted line, to form a multi-choke filter that prevents the propagation of parallel plate modes within the slot area thus further reducing leakage and excessive insertion loss.

35 Claims, 13 Drawing Sheets

Fig. 2
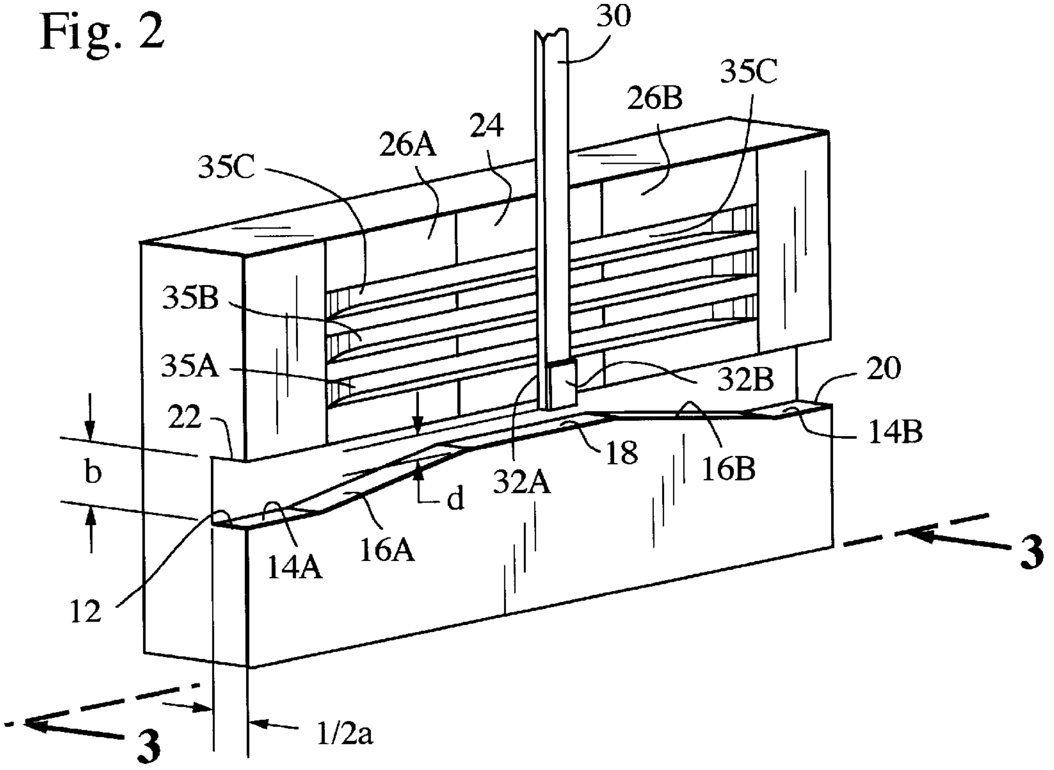
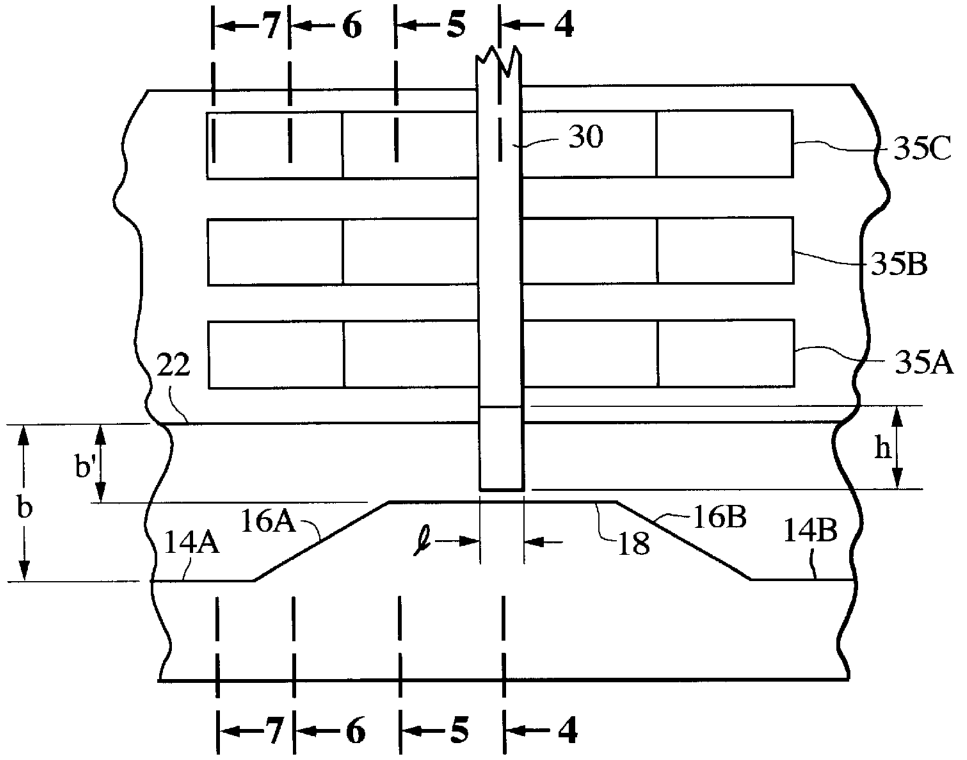
Fig. 3

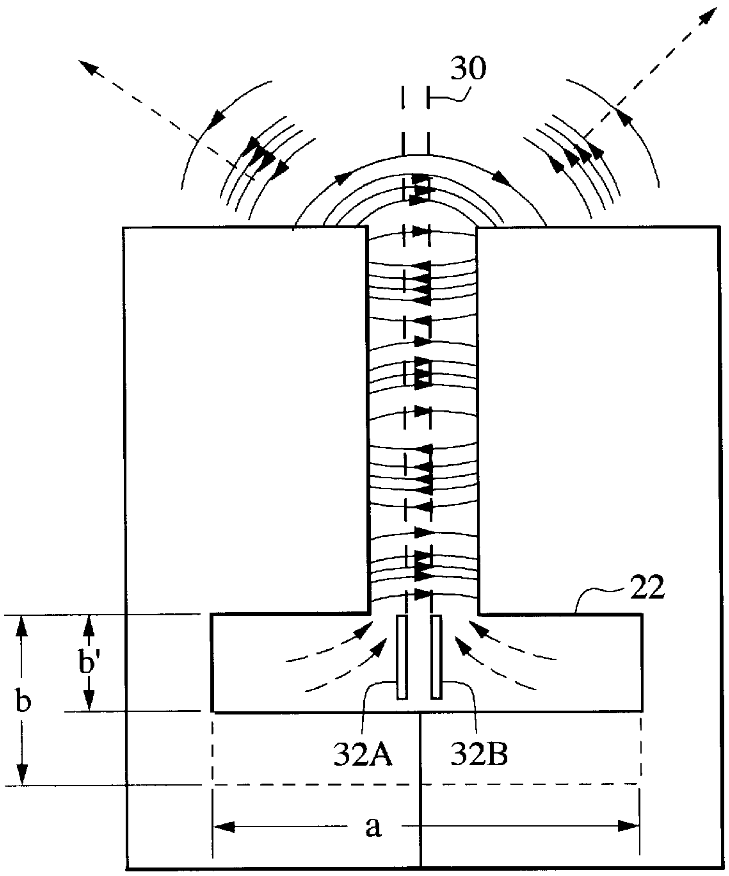
Fig. 14
Fig. 15
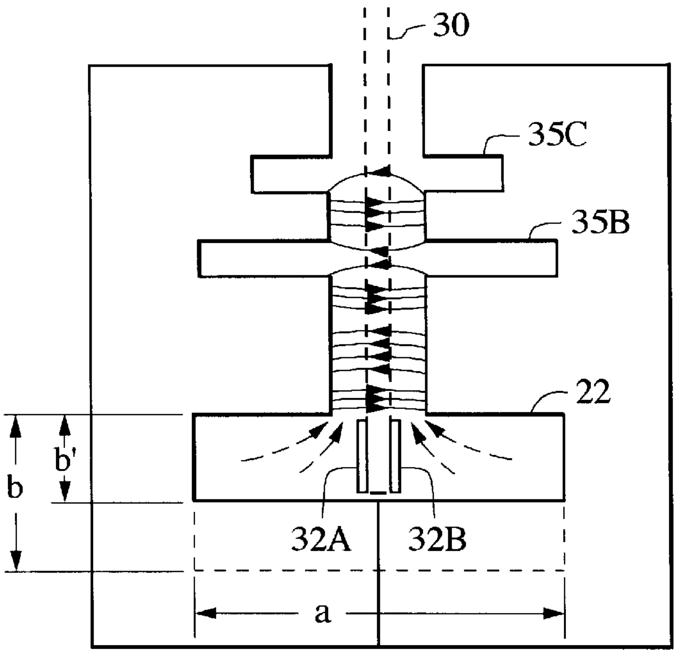

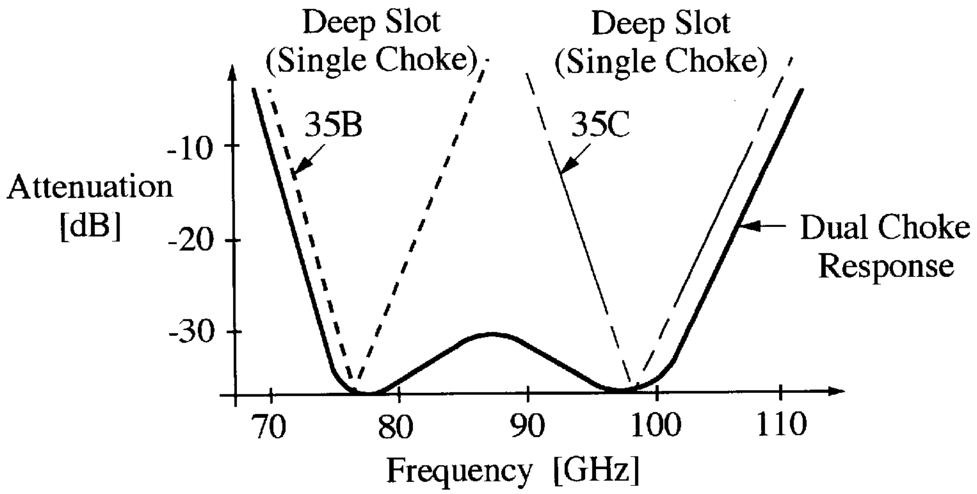
Fig. 16
Fig. 17
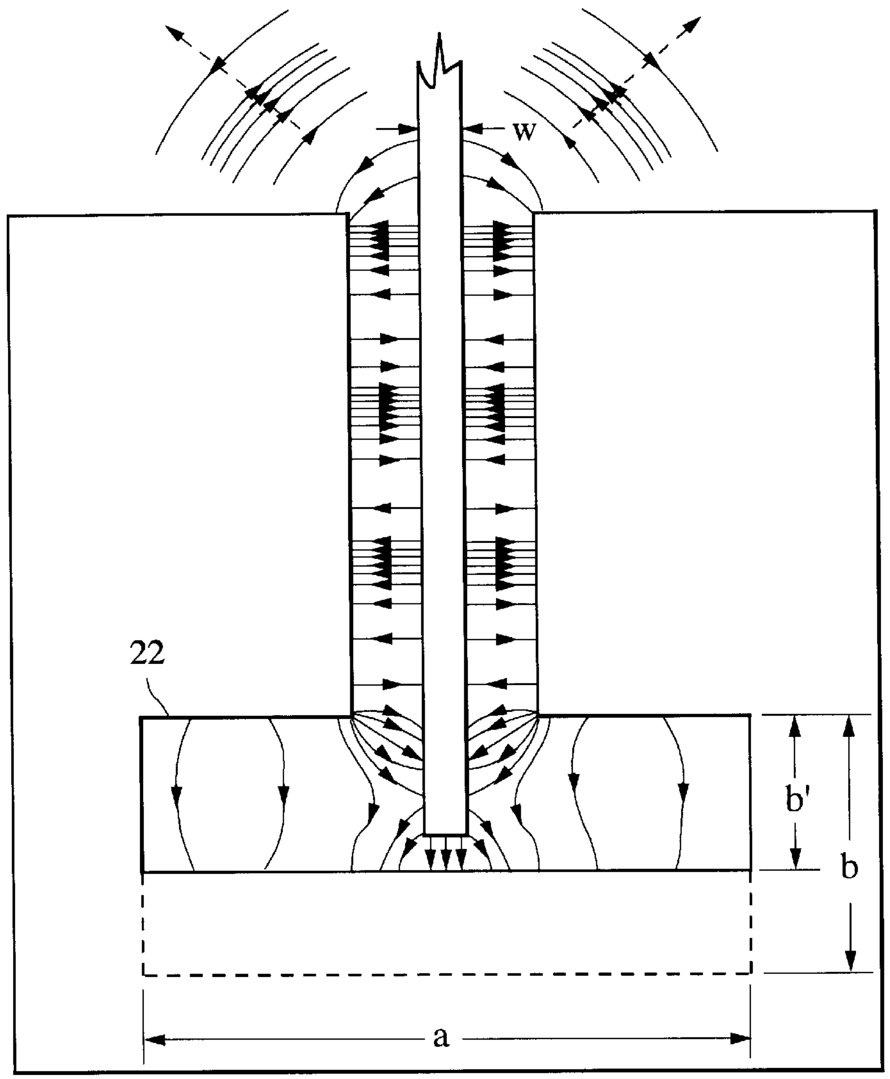

REDUCED HEIGHT WAVEGUIDE TUNER FOR IMPEDANCE MATCHING

TECHNICAL FIELD OF THE INVENTION

The field of the present invention is electrical devices, and, more particularly, electrical tuners adapted to terminate efficiently and in a controlled way arbitrary high frequency electrical signals.

BACKGROUND OF THE INVENTION

Tuners, or adjustable impedance transformers, are often used in microwave circuits and measurements to transform an impedance into another impedance such as a match (no reflections) or a complex conjugate impedance (maximum power transfer). Impedance tuners permit producing arbitrary terminations when optimizing or characterizing microwave devices, so they are essential in the design process of both the microwave components (such as transistors, diodes, amplifiers, mixers, MMICs, etc.) and systems. Through transforming impedances, tuners allow the improvement of device or system parameters (i.e., gain, power, noise, intermodulation distortion, adjacent channel power, etch).

The design processes for microwave circuits are extremely dependent upon the ability to accurately measure the characteristics of these circuits. To aid in this cause, a great variety of sophisticated measurement equipment has been generated In the past, different types of tuners have been developed to use waveguide media.

One known type of tuner is called an E-H tuner, and is described, for example, in P. I. Somlo and J. D. Hunter, *Microwave Impedance Measurement,* pp. 60–69, at p. 66, London, U.K.: Peter Peregrinus Ltd., 1985, and A. E. Bailey, Ed. "Reflections and Matching", *Microwave Measurements, Second Edition,* pp. 74–91, at p. 84, London, U.K.: Peter Peregrinus Ltd., 1989. This tuner includes a main waveguide junction section, having a waveguide junction at a common transverse plane with an E-plane and a separate H-plane waveguide section. Both of these transfer arms have an adjustable short circuit as termination; thus the E-H tuner can be used to match to any passive impedance. However, these types of tuners have several shortcomings and disadvantages. First, the magnitude and phase of the two arms are not independent, resulting in no simple way to tune arbitrary impedances. Second, they often have erratic tuning patterns. Furthermore, certain complex impedances cannot be obtained at all because of the resonances caused by imperfections in the mechanical tuning structure. Finally, due to the waveguide losses, these tuners have poor matching range (reflection coefficient of less than 0.9, but often less than 0.8) and high excessive dissipative loss (i.e., insertion loss in excess of what one would expect from the given reflection coefficient). Therefore, clearly the performance at higher frequencies is greatly degraded.

Another known tuner type is the slide-screw tuner, shown e.g. in G. L. Ragan, Ed. "Microwave Transmission Circuits", *M.I.T. Radiation Laboratories Series,* vol. 9, pp. 456–457 & 481–500, at p. 485, Massachusetts: Boston Technical Publishers, Inc., 1964; P. I. Somlo and J. D. Hunter, *Microwave Impedance Measurement,* pp. 60–69, at p. 63, London, U.K.: Peter Peregrinus Ltd., 1985; and A. E. Bailey, Ed. "Reflections and Matching", *Microwave Measurements, Second Edition,* pp. 74–91, at p. 80, London, U.K.: Peter Peregrinus Ltd., 1989.

SUMMARY OF THE INVENTION

An impedance tuner is described for achieving higher full bandwidth resonance-free reflection coefficient and lower dissipative loss than currently available tuners. This is achieved through a design of a novel slotted line tuner which is comprised of a waveguide section, a slot section, and a probe. The waveguide section begins with a standard sized waveguide port and transitions smoothly to a reduced height section. The reduced height section extends for a length equal to a minimum of 180 degrees phase shift at the lowest frequency of interest. This is followed again by a smooth transition back to standard waveguide size and the output port.

The slot section runs longitudinally down the center of the top wall of the waveguide. It begins with zero width and smoothly transitions to the width required to accept the probe, extends at this width for the length of the reduced height waveguide section, and then again transitions smoothly back to zero width. Embedded into the walls of the slot are multiple choke sections. The choke sections reduce in depth as the slot decreases in width.

The probe in one exemplary form is a rectangular dielectric vane that is constructed of a low loss, low dielectric constant material. Beginning at the bottom of the vane is a conductive metal plated area on each side that has a height equal to or slightly greater than the height of the reduced height section of the waveguide. The probe is inserted through the slot into the waveguide to increase the reflected energy, and is moved longitudinally along the slot to change the phase of the reflected energy.

BRIEF DESCRIPTION OF THE DRAWING

These and other features and advantages of the present invention will become more apparent from the following detailed description of an exemplary embodiment thereof, as illustrated in the accompanying drawings, in which:

FIG. 2 is a perspective view showing the preferred embodiment of the present invention through line 2—2 shown in FIG. 1, depicting the half of the waveguide housing and the full body of the insulated-plated probe of the disclosed electrical tuner.

FIG. 3 is a partial lengthwise cross-sectional view of the electrical tuner taken through line 3—3 of FIG. 2.

FIG. 14 shows the electromagnetic leakage of the low frequency waveguide modes in a case utilizing an insulated vane probe but without the choke filters.

FIG. 15 shows the case in which the multi-choke filter has been included with the insulated vane probe, and illustrates the suppression of the leaky waveguide mode energy.

FIG. 16 shows the attenuation of two deep slot choke sections, one having a depth of 0.037 inch, the other having a depth of 0.028 inch, as a function of frequency.

FIG. 17 is a cross-sectional view of a first alternate embodiment of an electrical tuner in accordance with the invention without the filter section (chokes) and using a fully conductive (metal) probe.

DETAILED DESCRIPTION OF THE PREFERRED EMBODIMENT

The present invention comprises a novel guided wave line impedance tuner for microwave, millimeter wave and sub-millimeter wave frequencies. The following description of the invention is provided to enable any person skilled in the microwave arts to make and use the present invention and set forth the best modes contemplated by the inventors of carrying out their invention. However, various modifications to the preferred embodiments will be readily apparent to those skilled in the art, and the generic principles defined herein may be applied to other embodiments. Thus, the present invention is not intended to be limited to the embodiment shown but is to be accorded the widest scope consistent with the principles and novel features disclosed herein.

Figure 1:
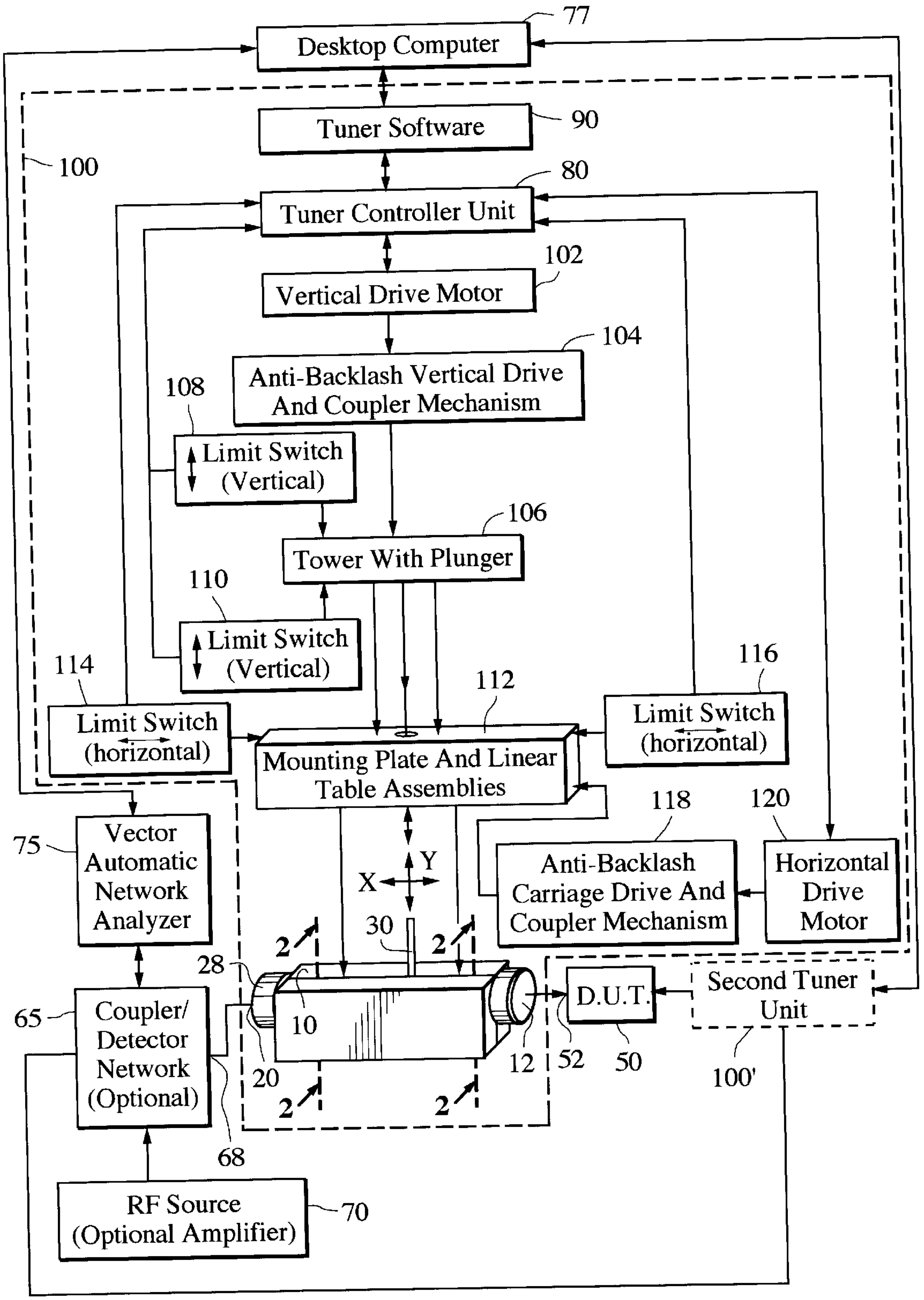
FIG. 1 is a simplified block diagram and view showing the base configuration and embodiment of the present invention disposed in a typical microwave measurement setup.
Figure 7:
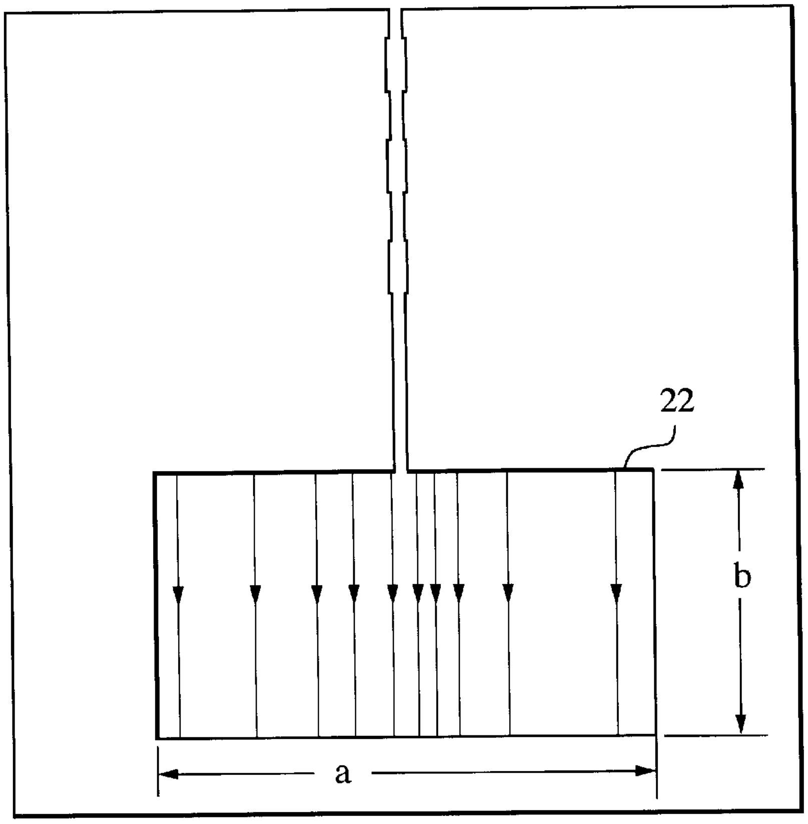
FIG. 7 is a cross sectional view of the electrical tuner taken through line 7—7 shown in FIG. 3, depicting the electrical field configuration at the plane at 7—7.

Referring now to FIG. 1, the tuner 10 is shown in a simplified layout diagram of a typical high frequency measurement setup. This is a basic setup, where the tuner 10 is disposed between Device Under Test (D.U.T.) 50 and an (optional) coupler/detector network 65. Then it is connected to an RF source (with optional amplifiers) 70 and to a Vector Automatic Network Analyzer (VANA) 75. As is well-known, a rectangular waveguide media has a cross sectional opening as shown in FIG. 7, and includes two pairs of boundary waveguide walls, each having a rectangular position relative to the other pair of walls. Typically, the physical dimension of one pair of wall length depicted as “a” in FIG. 7 is larger than that of the other pair of walls depicted as “b”. Generally speaking, the electric field “E” in the waveguide is normal to the “a” wall or broad-wall. Similarly, the “b” wall is called the narrow wall. The magnetic field “H” in the waveguide is distributed orthogonal to the electric field.

Based upon the physical dimensions of the broad wall and narrow wall of the waveguide and the dielectric constant of the material within the boundaries of the waveguide and any other material or mechanical structures inside, a characteristic impedance of the line may be computed. Impedance of a waveguide typically varies between several dozen ohms to several hundred ohms, depending on a:b ratio and the actual frequency within the bandwidth of the waveguide.

From the foregoing it is apparent that an electrical tuner 10 can be utilized between the interface 52 of the D.U.T. 50 and the interface 68 of the coupler/detector network 65, as shown in FIG. 1. Preferably, but not necessarily, this same type of media interface is used as the input interface 12 of the tuner 10 and the output interface 20 of the tuner 10. The electrical tuner offers the capability of tuning the complex impedance of the D.U.T. 50 relative to the complex impedance of the microwave test set-up. To accomplish a higher accuracy as well as speed in testing and tuning of the impedance, a tuner controller unit 80 under control of a desk top computer 77 and software 90 is connected to the tuner to allow further automation of the impedance matching.

The measurement setup of FIG. 1 is merely one exemplary setup. Other measurement setups can also employ the tuner of this invention. Exemplary measurement configurations for tuners are described, for example, in the “Product Data Manual” for “Automated Tuner Systems,” prepared by the assignee of this invention, Maury Microwave, Ontario, Calif., the entire contents of which are incorporated herein by this reference. In many systems, two or more of the tuner systems are employed. For example, one tuner system may be connected at one port of a device under test, and a second tuner system, identical to the first except that the two system may share controllers, may be connected at a second port of the device under test. This is shown in FIG. 1, wherein the second tuner system 100' is positioned at a second port of the D.U.T. 50.

Referring now to FIG. 2, the tuner 10 is shown in perspective view, cross-sectioned down the middle of the broad wall of the waveguide. It is noted that the drawings are not to scale, and relative proportions in some cases have been exaggerated to illustrate or emphasize certain features. The input interface 12 of the tuner 10 typically will match the dimensions of the standard waveguide size. Following a convenient length of standard waveguide section 14A, a transformer 16A is used to connect to a reduced height waveguide section 18. The transformer 16A provides a gradual change in the height of the waveguide from the standard height (b) of the section 14A to the reduced height (b') of the section 18. A second transformer 16B is used to connect the output of the section 18 to a second section 14B of standard size waveguide. The transition to the output interface 20 of the tuner 10 is typically similar to the transition at the input. While a smooth gradual change in height is illustrated, other forms of transitions could alternatively be employed, such as curved or stepped transition sections.

The height of the waveguide comprising the tuner 10 is reduced in the tuning region to increase the resonance-free bandwidth of the tuner. The height is typically reduced by 5% to 40% depending on the required bandwidth and mechanical constraints. Thus, the height b' of the section 18 is typically in the range of 0.60 to 0.95 times the height b of the standard height waveguide 14A, 14B.

Above the reduced height waveguide section 18 and at the symmetry line of the top wall 22 of the waveguide is a vertically opened top wall slot 24. The slot width transitions to zero at each end through tapered sections 26A and 26B. This slot allows insertion of a rectangular probe 30 into the reduced height waveguide section 18.

The probe 30 in this exemplary embodiment is a flat vane constructed of a nonconductive material with a low loss, low dielectric constant to prevent the propagation of all coaxial modes, and particularly the TEM mode, into the top wall slot 24. The bottom portion of the probe is plated with a conductive metal 32. The preferred embodiment of this device utilizes fused silica for the base material to allow sufficient strength and stability while maintaining low loss and a low dielectric constant, typically $\epsilon_{rel}$ less than 10. A low loss material is used for the plated section. While this form of the probe is especially preferred for high frequencies in the millimeter band, a solid metal probe can be employed in other implementations, typically operating at lower frequency bands. Moreover, other probe configurations can alternatively be employed, for example a cylindrical dielectric probe with a conductive tip.

The length (l) of the probe 30 is based on one-fourth of the guided-wave length of the band's highest frequency adjusted to achieve a flat amplitude response in the matching curves. In an exemplary embodiment, this was just slightly shorter as determined empirically. The plating thickness (t) (FIG. 4) on the probe 30 is typically 5 skin depths minimum. The width (w) of the probe 30 is typically determined by the smallest size that will yield adequate mechanical stability and strength. The height (h) of the plated portion of the probe 30 is at least as high as (b') to achieve the highest reflection coefficient possible. If the height (h) is significantly larger than (b') , then resonances may occur and dissipative losses may increase.

To further reduce dissipative losses multiple choke sections illustrated in this exemplary embodiment as sections 35A, 35B and 35C are cut into the top wall slot 24 of the waveguide. These choke sections reduce the propagation of energy upward through the slot. Each choke section is designed to cover a particular portion of the band, and thus have a cumulative response effect of the full band. While three sections are illustrated here, other configurations will be suitable for particular applications. For example, two or even one section may provide adequate leakage suppression for particular applications.

In this exemplary embodiment, the frequency band over which the tuner 10 is designed for operation is 75 GHz to 110 GHz. Waveguide dimensions a and b are 0.100 inch and 0.050 inch, respectively. The length of the reduced height waveguide section 18 is 0.250 inch, and its height is 0.040 inch. The top wall 22 of the waveguide has a thickness of 0.200 inch, and the choke sections are cut into the top wall slot. Choke section 35A is located 0.73 inch above the top of the waveguide opening, and is 0.032 inch long, correlating to about 95 GHz. Choke section 35B is located above the section 35A by 0.034 inch and is 0.037 inch deep, correlating to about 81 GHz. Choke section 35C is located above the section 35B by 0.034 inch, and it is 0.028 inch deep, correlating to about 109 GHz. Each section in this exemplary embodiment has a width of 0.014 inch.

Figure 4:
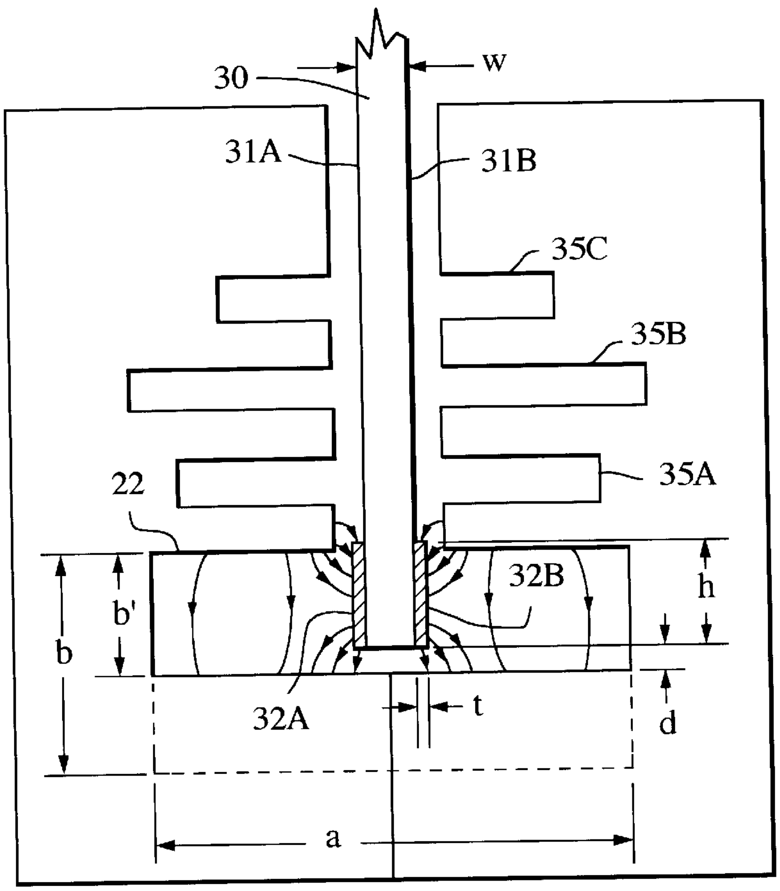
FIG. 4 is a cross sectional view of the electrical tuner taken through line 4—4 shown in FIG. 3, depicting the electrical field configuration at the plane at 4—4.

FIG. 3 is a partial lengthwise cross-sectional view of the electrical tuner 10 taken through line 3—3 of FIG. 2. FIG. 4 is a cross sectional view of the electrical tuner taken through line 4—4 shown in FIG. 3, depicting the electrical field configuration at the plane at 4—4. The configurations of the choke sections 35A, 35B and 35C are also visible in FIG. 4. The probe 30 has conductive layers 32A, 32B covering the tip of the flat broad surfaces 31A, 31B of the probe. In this exemplary embodiment, the narrow edges of the flat dielectric substrate comprising the probe, i.e. surfaces disposed transversely to the longitudinal axis of the waveguide, are not covered by the conductive layers, as shown in FIG. 4. Other configurations of the conductive tip can also be employed, e.g., a solid metal tip. Moreover, the probe cross-sectional configuration could alternatively be round or any other suitable shape.

Figure 5:
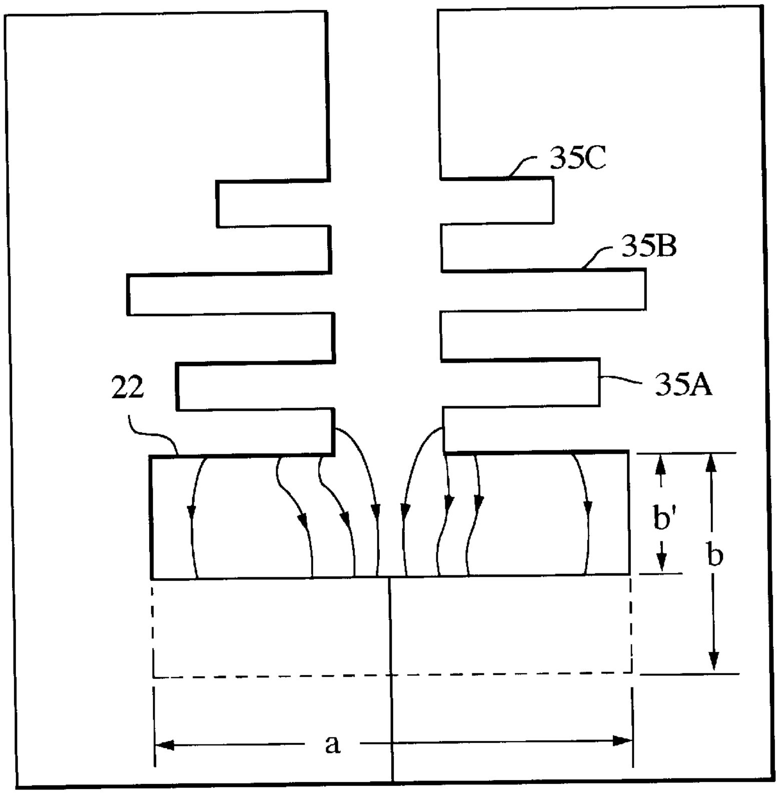
FIG. 5 is a cross sectional view of the electrical tuner taken through line 5—5 shown in FIG. 3, depicting the electrical field configuration at the plane at 5—5.
Figure 6:
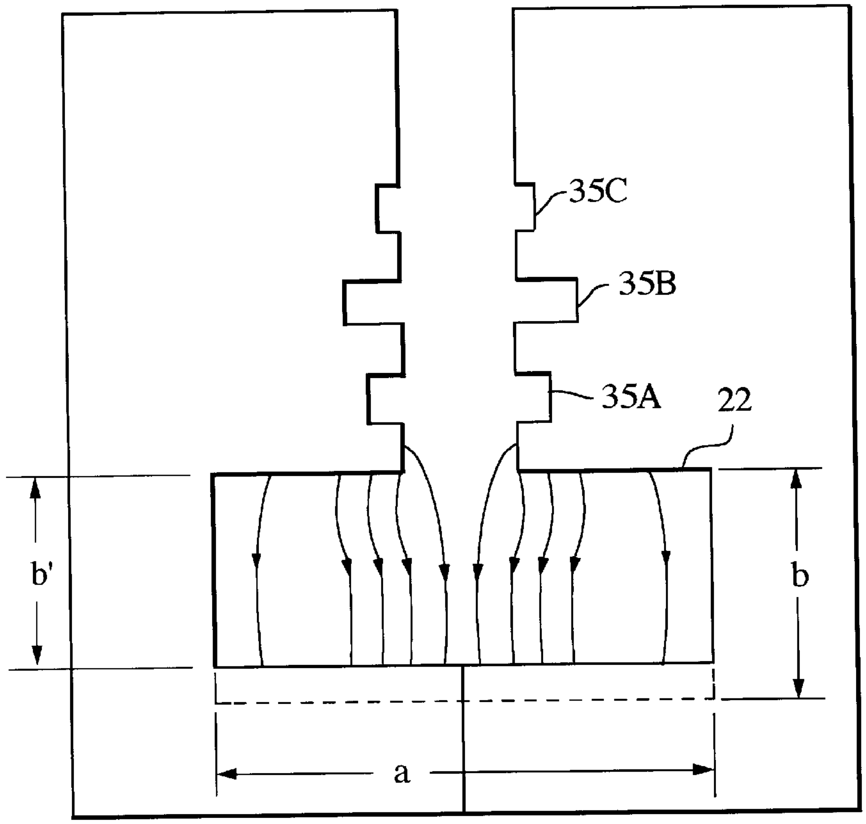
FIG. 6 is a cross-sectional view of the electrical tuner taken through line 6—6 shown in FIG. 3, depicting the electrical field configuration at the plane at 6—6.

FIG. 5 is a cross sectional view of the electrical tuner taken through line 5—5 shown in FIG. 3, depicting the electrical field configuration at the plane at 5—5. FIG. 6 is a cross-sectional view of the electrical tuner taken through line 6—6 shown in FIG. 3, depicting the electrical field configuration at the plane at 6—6. FIG. 7 is a cross sectional view of the electrical tuner taken through line 7—7 shown in FIG. 3, depicting the electrical field configuration at the plane at 7—7.

Referring again to FIG. 1, the tuner 10 comprises an automated tuner system generally shown as system 100. The system automates and controls the movement of the probe along horizontal (X) and vertical (Y) axes. The system 100 includes the tuner controller unit 80, a vertical drive motor 102 responsive to drive commands received from the controller. The motor 102 drives an anti-backlash vertical drive and de-coupler mechanism 104, which in turn is connected to a plunger apparatus 106 which carries the probe 30. Upper and lower vertical limit switches 108, 110 provide vertical end-of-travel signals to the controller 80.

The mechanism 104 includes a precision leadscrew and nut assembly (not shown) which drives a preloaded plunger 106 which is decoupled from the leadscrew assembly. The leadscrew nut is a floating non-rotating nut assembly constrained from axial movement by two eccentric bearings which allow for perpendicular movement. The end of the assembly is positioned against the pre-loaded plunger via tangential contact at the center line axis of the plunger. The mechanical coupler bridges out the eccentricity and the possible minor orientation difference between the center line of the shaft of the motor and the center line of the lead screw. A spring biases the plunger to an upper position, against the force applied by the leadscrew and nut assembly. The probe 30 is connected to the plunger. The vertical drive motor therefore turns the leadscrew, whose rotational movement is converted into an axially independent controlled vertical motion to precisely position the probe at desired locations along the vertical axis. Desirably, there is no hysteresis in the up-and-down movement, i.e. if the motor is switched to reverse directions, it moves the vane accurately and without mechanical delay, so very precise movement control is possible.

The vertical drive system is mounted on a carriage for movement along the horizontal (X) axis. The tuner 10 is mounted on a mounting plate 112. The horizontal drive system moves the carriage on which the vertical drive system is mounted along the X axis. The horizontal drive system includes the horizontal drive motor 120, which drives an anti-backlash carriage drive and decoupler mechanism 118. Left and right horizontal limit switches 114, 116 provide horizontal end-of-travel signals to the controller 80.

The mechanism 118 is a linear drive mechanism with antibacklash capability. The motor 120 drives a precision leadscrew (not shown) through a decoupler. The leadscrew assembly includes a nut follower attached to a carriage flange element so that as the nut is advanced or retracted along the length of the leadscrew, the carriage is also advanced or retracted.

Figure 8:
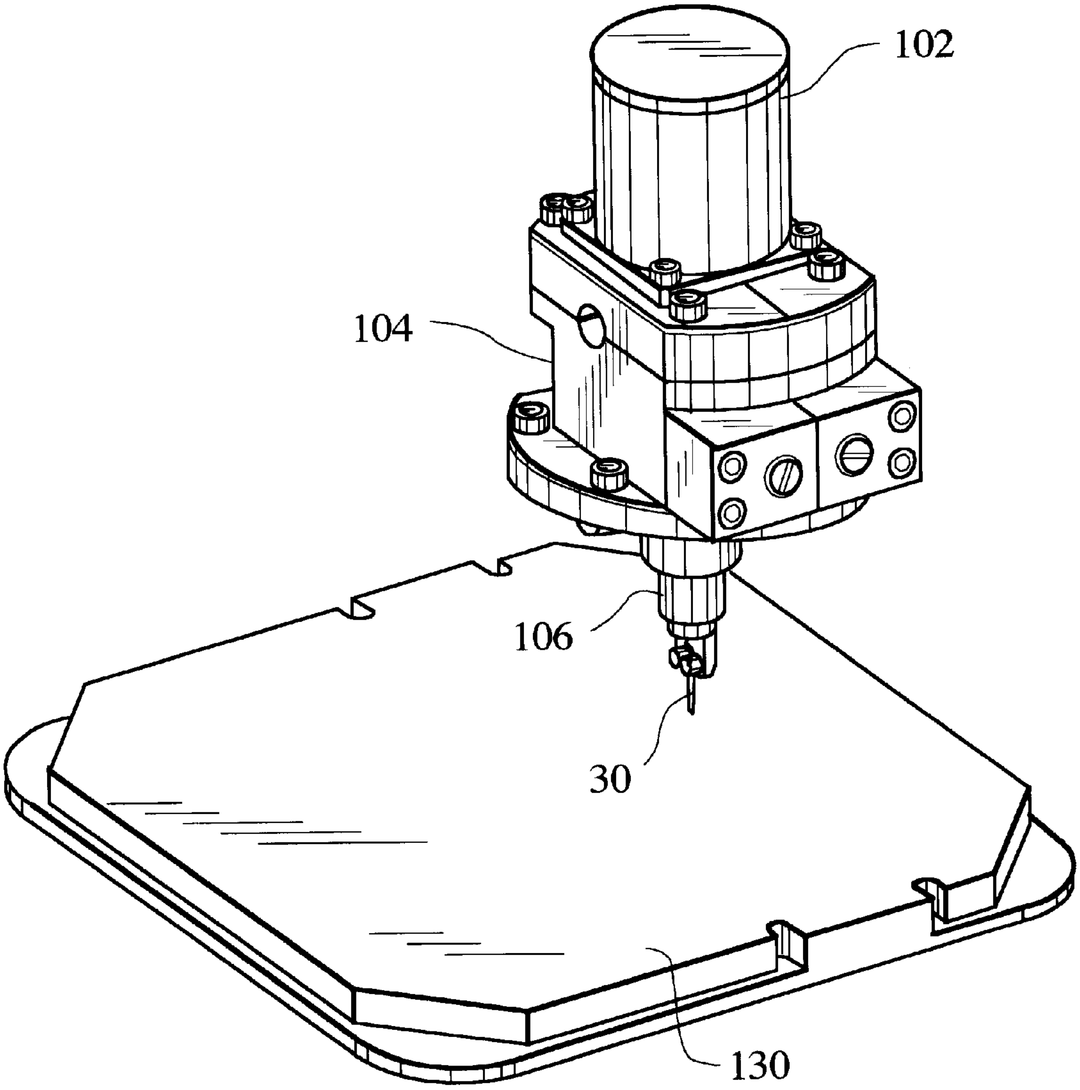
FIG. 8 is an isometric view of the vertical drive system for the tuner system of FIG. 1.
Figure 9:
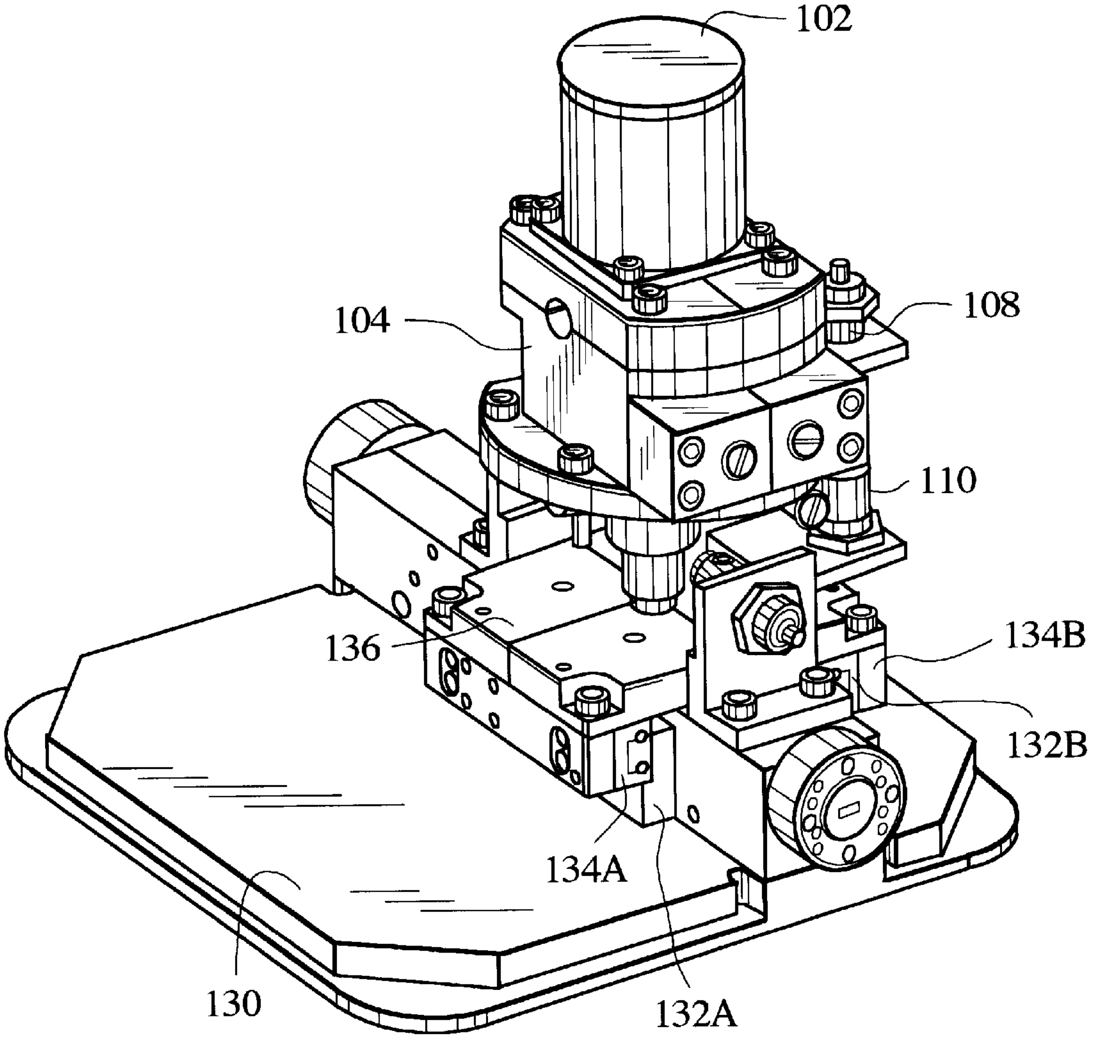
FIG. 9 is an isometric view of the tuner with the carriage on which the vertical drive system is carried.
Figure 10:
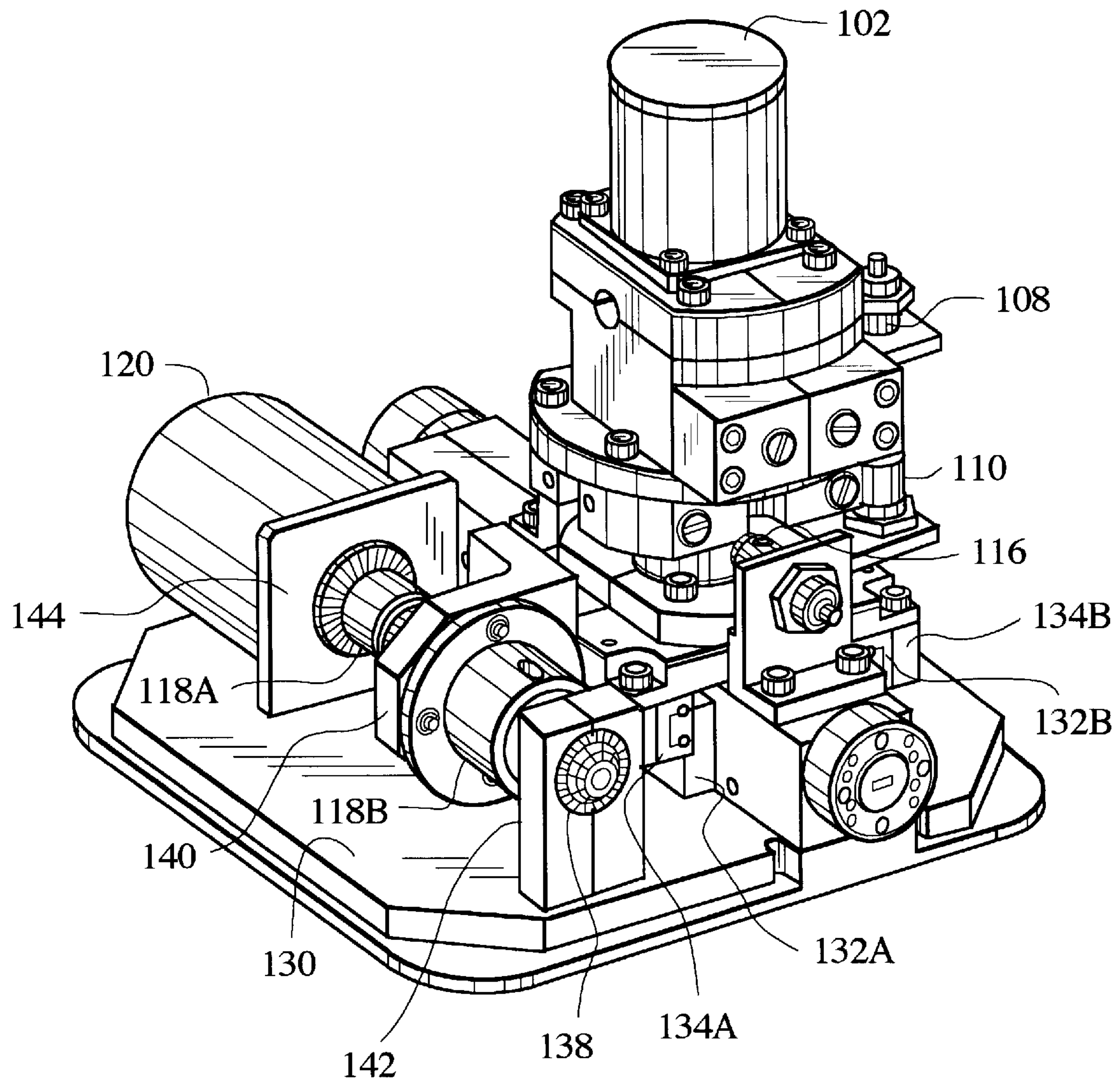
FIG. 10 is an isometric view of the tuner assembled with the vertical and horizontal drive systems.

FIGS. 8–10 are isometric views of an exemplary embodiment of aspects of the system 100. FIG. 8 is an isometric view of the vertical drive system in isolation. Shown here are the motor 102, the housing for the vertical drive and decoupler mechanism 104 and the plunger 106 which carries the probe 30. These are shown above the base plate 130.

FIG. 9 is an isometric view of the tuner 10 with the carriage on which the vertical drive system is carried. A pair of linear bearing rails 132A, 132B straddle the tuner 10, and are secured to the base plate 130. Corresponding bearing slides 134A, 134B are mounted on the bearing rails, and the vertical drive mounting plate 136 is fastened securely on the bearing slides. The linear bearings comprising the rails 132A, 132B and the slides 134A, 134B are precisely aligned in parallel to the longitudinal axis of the waveguide of the tuner, and constrain movement of the table 136 and the vertical drive system and probe 30 so that the probe remains aligned with the center line of the waveguide as the carriage is moved by the horizontal drive system.

FIG. 10 is an isometric view of the tuner 10 assembled with the vertical and horizontal drive systems. This shows the horizontal motor 120, the decoupler mechanism 118A, the antibacklash linear drive 118B which is connected to the carriage flange 140, and the floating bearing 138, a simple linear thrust bearing, for the linear horizontal drive. The motor 120, mechanism 118A and drive 118B are supported on the base table by brackets 142, 144. The decoupler mechanism, e.g. a universal joint, bridges out the eccentricity and the possible minor orientation difference between the center line of the horizontal motor shaft and the center line of the leadscrew of the linear drive 118B. The drive 118B includes the linear leadscrew and nut, preloaded at all times with a spring acting against the nut.

The motors 102 and 120 are controlled by the tuner controller unit 80 and software 90 to precisely position the probe 30 along the horizontal tuning range of the tuner 10, and at a desired depth.

Figure 11:
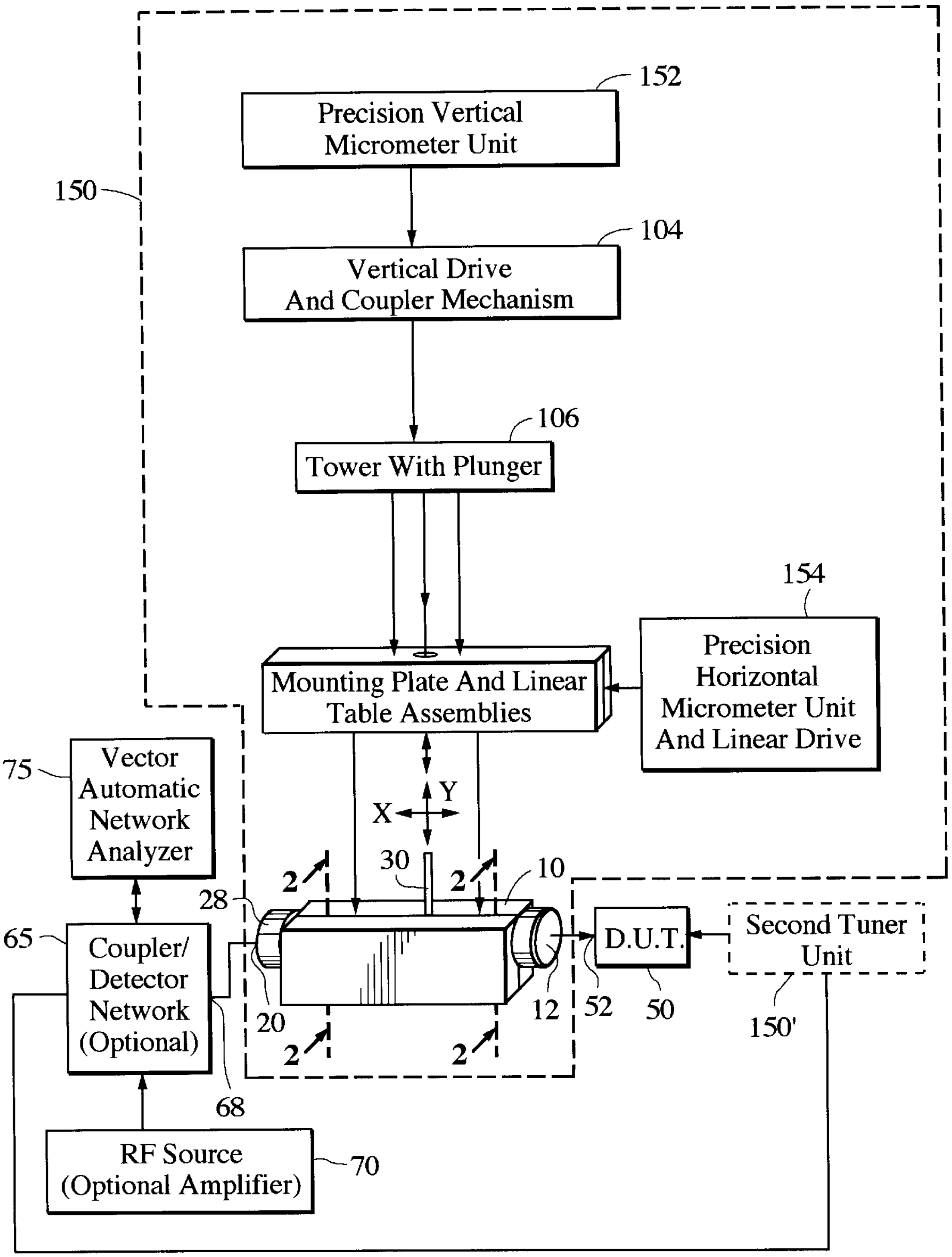
FIG. 11 is a block diagram of an exemplary manual tuner system employing a tuner in accordance with the invention.

Alternatively, the tuner 10 can be employed in a manual system, wherein the user manually actuates the drive mechanisms to position the probe. An exemplary manual tuner system 150 is shown in block diagram form in FIG. 11. This system is similar to the automated system of FIG. 1, except that the motors 102 and 104 are replaced with precision vertical and horizontal micrometer drive units 152, 154, respectively. The system operator manually operates the micrometer units to position the probe.

An important feature of the invention is the use of reduced height waveguide at the tuning area. The reduced height waveguide has higher cut-off frequencies for the first few relevant higher order modes generated in the tuner's waveguide section by any discontinuity or imperfections. The reduced height waveguide widens the tuner's bandwidth because the important first higher order mode(s), i.e. the possible higher order waveguide modes other than the $TE_{10}$ dominant mode, is pushed further out to higher frequencies.

The invention addresses several other problems of known waveguide tuner systems. The use of nonconductive material for the probe, i.e. the insulated vane, with the proper metallization only at the tip, is an important feature of the invention. This prevents all coaxial modes from propagating inside the slotted area. This mode prevention operates in the following manner. The narrow slot along the top wall of the waveguide accommodates the probe that penetrates into the waveguide through the slot. In this manner, the waveguide is "open" and it is possible to have a certain portion of the signal propagating in the waveguide to emerge out or leak through the slot.

The most critical coaxial mode, as a possible source of leakage, is the coaxial T.E.M. (transverse electric and magnetic) mode that can actually propagate from the lowest frequencies of the waveguide band. The probe could serve as a center conductor, and the slot walls as the outer conductor. The probe can then act as an antenna (mono-pole), readily coupling power of the waveguide into the slot where it can further propagate in the T.E.M. mode or any of the higher order modes. By use of the insulator as the probe, the invention prohibits the propagation of all coaxial modes, including the most important basic T.E.M. mode out of the slot. In fact, an insulated probe with a conductive tip can be employed advantageously in waveguide tuners which do not have a reduced height waveguide section at the tuning region or a choke filter, to reduce leakage due to coaxial mode propagation from the slot.

Figure 12:
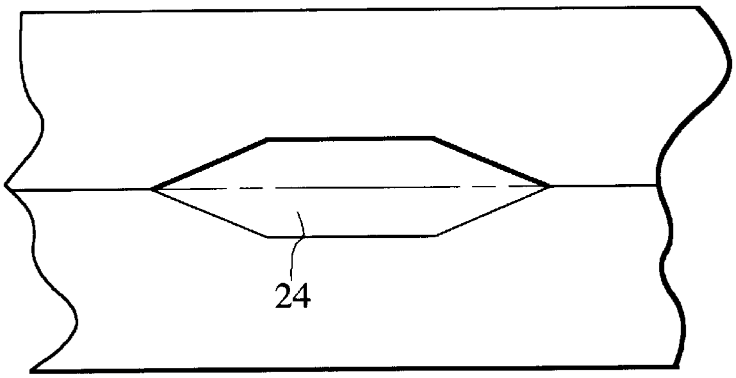
FIG. 12 is a top view of the waveguide slot formed in the waveguide tuner.

Having achieved suppression of all coaxial modes, including the T.E.M. mode inside the slot area by use of the insulator probe element, it is also desirable to reduce leakage due to propagation of lower frequency waveguide modes within the slot. Consider the slot formed in the top wall of the waveguide, as shown in the top view of FIG. 12. The slot will also act like a waveguide at high frequencies. For the example illustrated, the slot has a total length of 0.75 inch, and a width of 0.020 at the tuning region. Because of the 0.750 inch total length of the slot, it can be considered as a WR75 super-reduced-height waveguide (height=0.20 inch) with a hexagonal shape. WR75 waveguide with a standard height of 0.375 has a fundamental mode operational bandwidth of 10 GHz to 15 GHz. It will, however, propagate many higher order modes as well as the fundamental mode at the desired band of 75 GHz to 110 GHz for this exemplary embodiment. When the tuner 10 is operated in the range of 75–110 GHz, and if somehow a portion of the signal is coupled, by the probe or otherwise, into the slot, the "slot waveguide" can allow the propagation of this basic $TE_{10}$ mode and several higher order waveguide modes, causing leakage. This leakage is suppressed according to aspects of the invention, including use of the choke filter 35.

Figure 13:
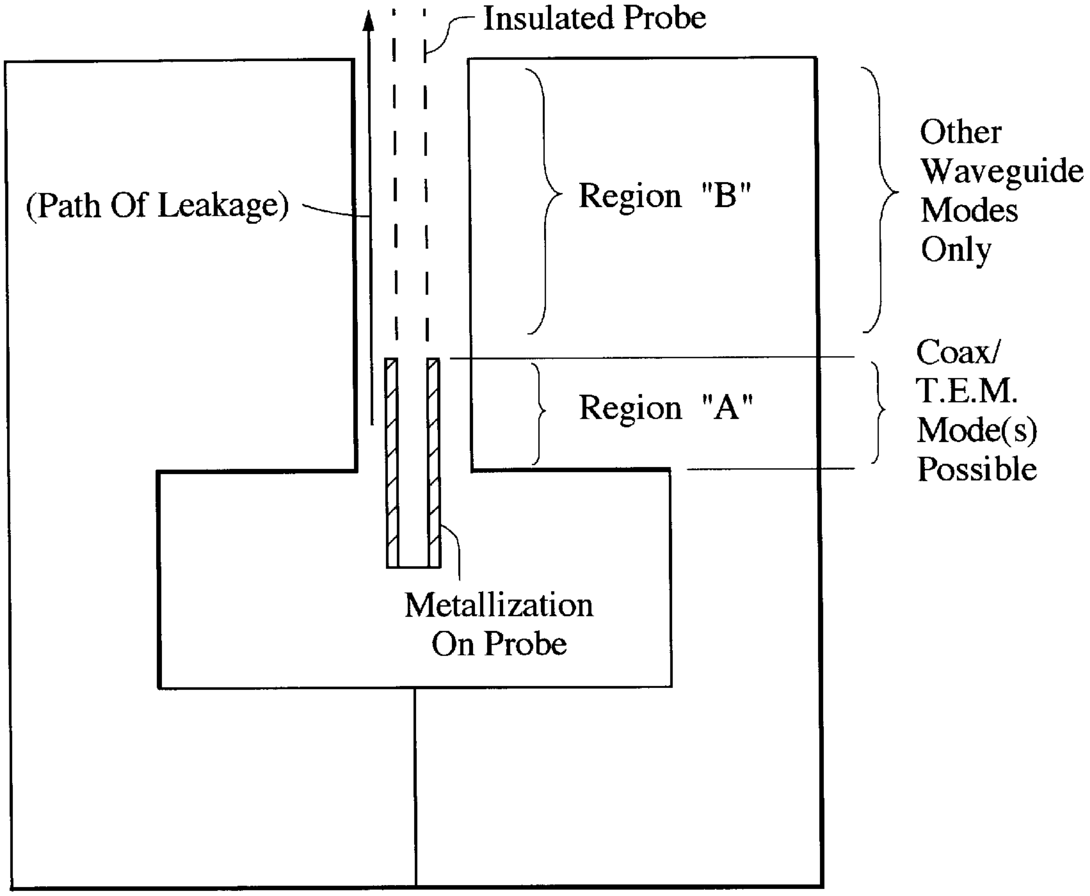
FIG. 13 is a cross-sectional view of a waveguide tuner with an insulator probe in accordance with the invention, with the conductive tip partially inserted into the waveguide.

When the probe penetration depth is such that approximately half of the metallization penetrates into the waveguide and the other half of the metallization is withdrawn into the slot, it is possible that the probe couples into the slot with the coaxial/TEM mode at the waveguide opening of the slot. This is illustrated in FIG. 13 as region A. Reaching the point where the metallization ends, i.e. region B, the TEM mode cannot propagate any more, because there is no metallic center conductor for a coaxial propagation. However, the TEM mode can generate some other low frequency waveguide modes that can readily propagate into region B. The choke 35 is a very useful feature, even when the insulated probe structure is employed.

At higher frequencies, there is typically a more serious leakage problem, since the waveguide sizes are smaller, and so to have a mechanically realizable and producible probe that fits in the slot, the slot has to be opened wider relative to the broad wall size. This makes the very high frequency/small size slotted line tuners more vulnerable to leakage. Significant reduction of this leakage is achieved by two different techniques. The first is to minimize the excitation of the modes by setting the slot and vane (probe) into the symmetry line of the waveguide to the extent mechanically and electrically possible, since the modes are excited when the probe is not centered in the slot. To accomplish this, the slot is manufactured into the center of the waveguide line to the maximum extent permitted by the machine processing. Also during operation, the vane (probe) is kept parallel and centered during its travel along the slot at all times, by the mechanical systems used to move the vane along its ranges of movement.

Figure 20:
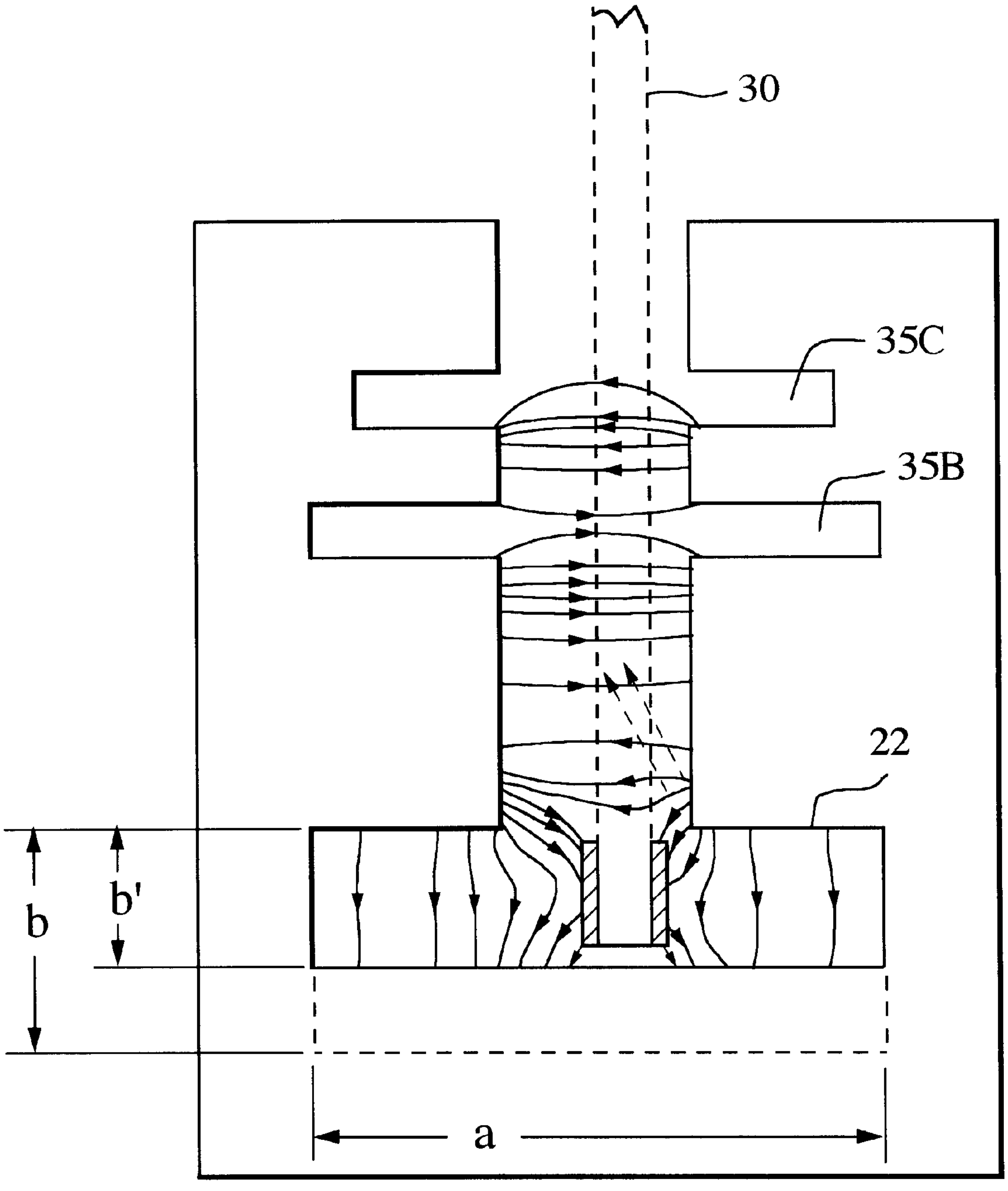
FIG. 20 is a cross-sectional view of a waveguide tuner, with the probe located offset from the waveguide center line.

The second technique for reducing propagation of waveguide modes within the slot area is to use the choke 35 machined into the waveguide housing. Important features of the choke include the disposition of the choke elements in the slot in the waveguide, close to the waveguide opening, the use of multiple choke elements to cover different parts of the band range, and the fact that the filter is reactive, reflecting energy back from the slot into the waveguide, rather than absorbing it, thereby reducing dissipative losses even further. FIG. 14 shows the electromagnetic leakage of the low frequency waveguide modes in a case utilizing an insulated vane probe but without the choke filters. FIG. 15 shows the case in which the multi-choke filter 35 has been included with the insulated vane probe, and illustrates the suppression of the leaky waveguide mode energy. FIG. 16 shows the attenuation of a multi-choke filter suitable for this embodiment, comprising two deep slot choke sections, one having a depth of 0.037 inch, the other having a depth of 0.028 inch, as a function of frequency. The former choke section provides excellent attenuation at the lower part of the band, and the latter choke section provides excellent attenuation at the upper part of the band. The combined dual choke response is also shown for the frequency band. The multi-choke filter is useful for suppressing leakage even if the probe is located off the waveguide center line, resulting in excitation of higher order modes. This is shown in FIG. 20, wherein a multi-choke filter having choke sections 35B, 35C is disposed along the slot passageway, and the probe vane is offset from the center of the waveguide opening.

FIG. 17 is a cross-sectional view of a first alternate embodiment of an electrical tuner in accordance with the invention without the filter section (chokes) and using a fully conductive (metal) probe; the electrical field configuration, including the generated coaxial mode in the slot area is depicted. Here, the tuner employs the reduced height waveguide in the tuning region, and so obtains the benefit of increased bandwidth. This advantage is achieved even without the use of the insulated probe structure and the choke filter.

Figure 18:
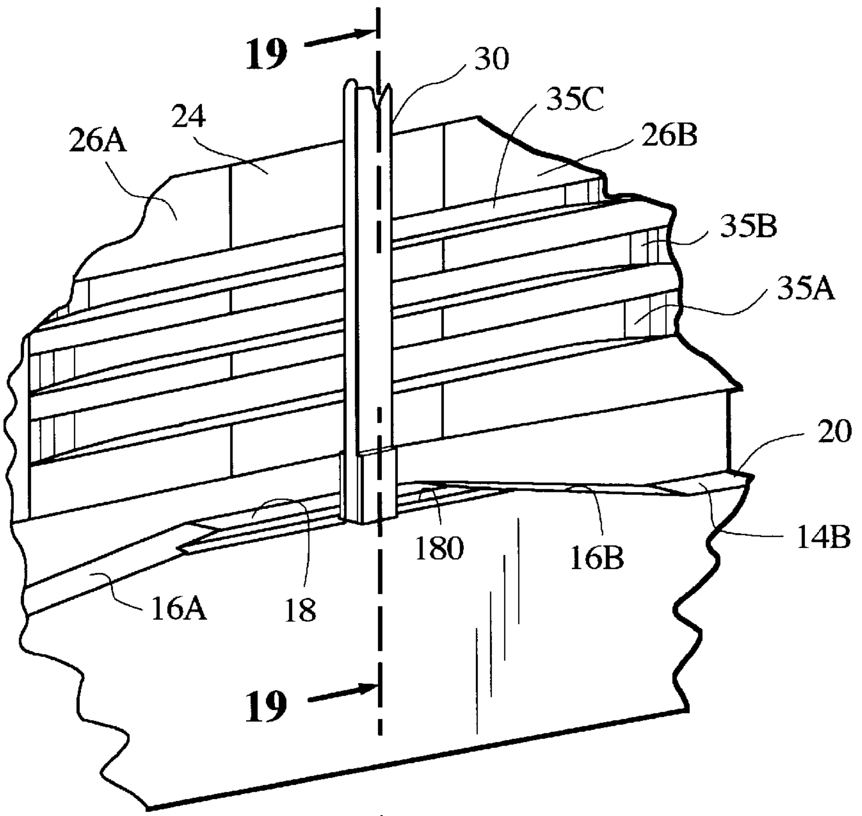
FIG. 18 is an isometric, broken-away view of a waveguide tuner similar to tuner 10 as illustrated in FIG. 2, but with a groove formed in the bottom broad wall of the waveguide.
Figure 19:
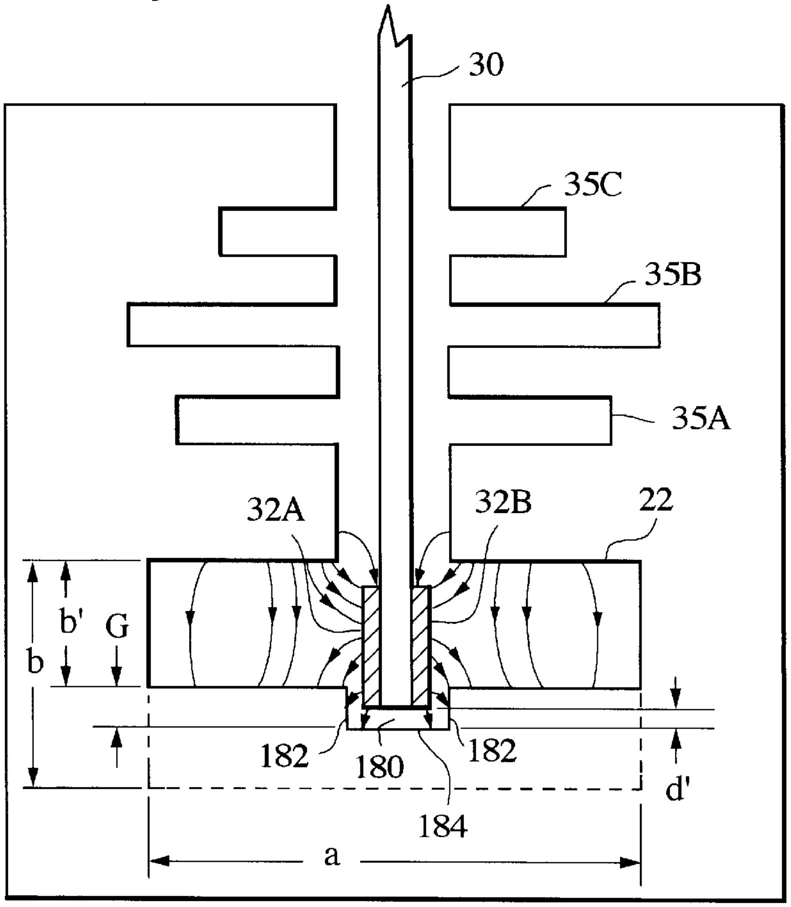
FIG. 19 is a cross-section view taken along line 19—19 of FIG. 18.

FIGS. 18 and 19 illustrate a further alternate embodiment of the invention. FIG. 18 is an isometric, broken-away view of a waveguide tuner similar to tuner 10 as illustrated in FIG. 2, but with a groove 180 formed in the bottom broad wall of the waveguide. FIG. 19 is a cross-section view taken along line 19—19 of FIG. 18. The width of the groove 180 is approximately the same, or slightly larger, as the width of the slot itself. The depth of the grove into the bottom wall is typically on the order of a couple of thousandths of an inch, for the case of a tuner operating in the 75 GHz to 110 GHz range. The function of the groove 180 is as follows. To achieve the maximum reflection condition for the waveguide tuner, i.e. the maximum probe penetration, the d distance (FIG. 4) has to be extremely small, on the order of a couple of tenths of a thousandth of an inch, or as small as the probe can safely be held as close to the bottom wall as possible without touching it. Because of the proximity of the metallized probe and the bottom wall, the electromagnetic field becomes extremely dense and very high. Now, with the groove formed in the bottom wall, the same high reflection can be achieved with a spacing d' greater than d condition, because the field is better distributed between the probe and the sidewalls 182 and bottom 184 of the groove. The presence of the groove sidewalls reduces the concentration of the field and arcing will be less likely to happen. Also, increased tip capacitance, i.e. the capacitance between the probe metallization and the bottom of the waveguide, can be achieved using the sidewalls of the groove. Thus, the groove provides the benefit of higher power handling and higher maximum reflection capability.

It is understood that the above-described embodiments are merely illustrative of the possible specific embodiments which may represent principles of the present invention. For example, while the exemplary embodiments described herein are described for an operating band of 75 GHz to 110 GHz, and are believed to be particularly useful for millimeter wave application, the invention can be readily employed in other applications for higher, lower or wider frequency bands, by appropriate selection of the size parameters, as will be appreciated by those skilled in the art. Other arrangements may readily be devised in accordance with these principles by those skilled in the art without departing from the scope and spirit of the invention.

What is claimed is:

1. An RF waveguide tuner for impedance matching, comprising:

a reduced height waveguide section comprising a conductive wall and having a slot formed in the wall along a waveguide tuning area, the reduced height waveguide section having a reduced height dimension and a width dimension;

an input waveguide section adjacent a first end of said reduced height waveguide section which transitions from an input waveguide height dimension which is larger than said reduced height dimension, the input waveguide section having a width dimension equal to the width dimension of the reduced height waveguide section;

an output waveguide section adjacent a second end of said reduced height waveguide section which transitions from said reduced waveguide height dimension to said an output waveguide height dimension which is larger than the reduced height waveguide dimension, and wherein the reduced height dimension is from about 5% to about 40% smaller than the input waveguide height dimension and the output waveguide height dimension, the output waveguide section having a width dimension equal to the width dimension of the reduced height waveguide section;

a probe extendable into the waveguide through the slot;

apparatus for selectively positioning the probe at positions at variable depths within the waveguide to vary the reflection coefficient and within a tuning range of movement along the slot to vary the phase of the reflections from the probe;

wherein the reduced height waveguide provides higher cut-off frequencies for higher order modes excited in the waveguide due to discontinuities, thereby widening a bandwidth of the tuner.

2. The tuner of claim 1 wherein the tuner is adapted for an operating frequency band covering 75 GHz to 110 GHz.

3. The tuner of claim 1 wherein said probe comprises a dielectric probe structure having a conductive tip region, the conductive tip region for disposition into the waveguide through the slot, wherein the dielectric probe structure suppresses propagation of coaxial mode electromagnetic energy from the waveguide through the slot.

4. The tuner of claim 1 wherein the dielectric probe structure comprises a flat vane structure fabricated of a low loss, low dielectric constant material.

5. The tuner of claim 4 wherein the conductive tip region is defined by first and second layers of conductive material formed on opposite sides of said flat vane structure.

6. The tuner of claim 1 wherein the conductive wall in which the slot is formed has a thickness, and wherein a choke filter is defined in said slot to suppress electromagnetic energy leakage through the slot.

7. The tuner of claim 6 wherein said tuner operates over a predetermined operating frequency band, and said choke filter comprises a plurality of choke elements each defined to operate over a given frequency sub-band comprising the operating frequency band.

8. The tuner of claim 1 wherein said apparatus for selectively positioning the probe includes a manually operated vertical positioning system and a manually operated horizontal positioning system.

9. The tuner of claim 1 wherein the waveguide is a rectangular waveguide including a first broad wall, and the slot is formed in the first broad wall.

10. An RF waveguide tuner for impedance matching, comprising:

a reduced height rectangular waveguide section comprising a first conductive broad wall and a second conductive broad wall located in parallel to the first wall, and having a slot formed in the first wall along a waveguide tuning area;

a probe extendable into the waveguide through the slot;

apparatus for selectively positioning the probe at positions at variable depths within the waveguide to vary the reflection coefficient and within a tuning range of movement along the slot to vary the phase of the reflections from the probe;

a groove formed in the second broad wall underlying a longitudinal path of travel of the probe to permit further penetration of the probe into the waveguide without contacting the second broad wall;

wherein the reduced height waveguide provides higher cut-off frequencies for higher order modes excited in the waveguide due to discontinuities, thereby widening a bandwidth of the tuner.

11. An RF waveguide tuner for impedance matching, comprising:

a rectangular waveguide section comprising a first conductive broad wall and a second conductive broad wall located in parallel to the first wall, the waveguide section having a slot formed in the first wall along a waveguide tuning area;

a probe extendable into the waveguide through the slot, said probe comprising a dielectric probe structure having a conductive tip region, the conductive tip region for disposition into the waveguide through the slot, wherein the dielectric probe structure suppresses propagation of coaxial mode electromagnetic energy from the waveguide through the slot;

a groove formed in the second broad wall underlying a longitudinal path of travel of the probe to permit further penetration of the probe into the waveguide without contacting the second broad wall;

apparatus for selectively positioning the probe at positions at variable depths within the waveguide to vary the reflection coefficient and within a tuning range of movement along the slot to vary the phase of the reflections from the probe.

12. An RF waveguide tuner for impedance matching, comprising:

a waveguide section comprising a conductive wall and having a slot formed in the wall along a waveguide tuning area, the waveguide section defining a waveguide passageway having first and second opposed signal ports through which RF energy is propagated during tuner operation, the passageway having a height dimension, and wherein a probe-receiving passageway having conductive walls is defined in communication with the slot;

a probe extendable into the waveguide section passageway through the slot, said probe comprising a dielectric probe structure having a conductive tip region which has a height at least as large as the height dimension of the waveguide passageway, the conductive tip region for disposition into the waveguide through the slot, wherein the dielectric probe structure suppresses propagation of coaxial mode electromagnetic energy from the waveguide through the slot;

apparatus for selectively positioning the probe at positions at variable depths within the waveguide to vary the reflection coefficient and within a tuning range of movement along the slot to vary the phase of the reflections from the probe.

13. The tuner of claim 12 wherein the dielectric probe structure comprises a flat vane structure fabricated of a low loss dielectric material.

14. The tuner of claim 13 wherein the dielectric material has a low dielectric constant.

15. The tuner of claim 13 wherein the conductive tip region is defined by first and second layers of conductive material formed on opposite sides of said flat vane structure.

16. The tuner of claim 12 wherein a choke filter is defined in said probe-receiving passageway to suppress electromagnetic energy leakage through the slot.

17. The tuner of claim 16 wherein said tuner operates over a predetermined operating frequency band, and said choke filter comprises a plurality of choke elements each defined to operate over a given frequency sub-band comprising the operating frequency band.

18. The tuner of claim 12 wherein said apparatus for selectively positioning the probe includes a manually operated vertical positioning system and a manually operated horizontal positioning system.

19. The tuner of claim 12 wherein said apparatus for selectively positioning the probe includes a motor-driven vertical positioning system and a motor-driven horizontal positioning system.

20. The tuner of claim 12 wherein the waveguide is a rectangular waveguide including a broad wall, and the slot is formed in the broad wall.

21. The tuner of claim 12 wherein the tuner is adapted for an operating frequency band covering 75 GHz to 110 GHz.

22. An RF waveguide tuner for impedance matching, comprising:

a rectangular waveguide section comprising a first conductive broad wall and a second conductive broad wall, the waveguide section having a slot formed in the first wall along a waveguide tuning area, and wherein a choke filter is defined in said slot in fixed relation to the waveguide to suppress electromagnetic energy leakage through the slot;

a probe extendable into the waveguide through the slot;

a groove formed in the second broad wall underlying a longitudinal path of travel of the probe to permit further penetration of the probe into the waveguide without contacting the second broad wall;

apparatus for selectively positioning the probe at positions at variable depths within the waveguide to vary the reflection coefficient and within a tuning range of movement along the slot to vary the phase of the reflections from the probe.

23. An RF waveguide tuner for impedance matching, comprising:

a waveguide section comprising a conductive wall and having a slot formed in the wall along a waveguide tuning area, the waveguide section defining a waveguide passageway having first and second opposed signal ports through which RF energy is propagated during tuner operation, and wherein a probe-receiving passageway having conductive walls is defined in communication with said slot, and wherein a choke filter is defined in said probe-receiving passageway in fixed relation to the waveguide to suppress electromagnetic energy leakage through the slot and the probe-receiving passageway;

a probe extendable into the waveguide through the slot and the probe-receiving passageway;

apparatus for selectively positioning the probe at positions at variable depths within the waveguide to vary the reflection coefficient and within a tuning range of movement along the slot to vary the phase of the reflections from the probe.

24. The tuner of claim 23 wherein said tuner operates over a predetermined operating frequency band, and said choke filter comprises a plurality of choke elements each defined to operate over a given frequency sub-band comprising the operating frequency band.

25. The tuner of claim 23 wherein the waveguide is a rectangular waveguide including a broad wall, and the slot is formed in the broad wall.

26. The tuner of claim 23 wherein the tuner is adapted for an operating frequency band covering 75 GHz to 110 GHz.

27. An automated waveguide tuner system, comprising:

a reduced height rectangular waveguide section comprising a first conductive broad wall and a second conductive broad wall located in parallel to the first broad wall, the waveguide section having a slot formed in the wall along a waveguide tuning area;

a probe extendable into the waveguide through the slot;

a vertical drive apparatus for selectively positioning the probe at positions at variable depths within the waveguide to vary the reflection coefficient, said vertical drive apparatus including a first electric motor drive;

a horizontal drive apparatus for selectively positioning the probe within a tuning range of movement along the slot to vary the phase of the reflections from the probe, said horizontal drive apparatus including a second electric motor drive;

a groove formed in the second broad wall underlying a longitudinal path of travel of the probe to permit further penetration of the probe into the waveguide without contacting the second broad wall;

wherein the reduced height waveguide provides higher cut-off frequencies for first higher order modes excited in the waveguide due to discontinuities, thereby widening a bandwidth of the tuner.

28. An automated waveguide tuner system, comprising:

a reduced height waveguide section comprising a conductive wall and having a slot formed in the wall along a waveguide tuning area, the reduced height waveguide section having a reduced height dimension and a width dimension;

an input waveguide section adjacent a first end of said reduced height waveguide section which transitions from an input waveguide height dimension which is larger than said reduced height dimension, the input waveguide section having a width dimension equal to the width dimension of the reduced height waveguide section;

an output waveguide section adjacent a second end of said reduced height waveguide section which transitions from said reduced waveguide height dimension to said an output waveguide height dimension which is larger than the reduced height waveguide dimension, and wherein the reduced height dimension is from about 5% to about 40% smaller than the input waveguide height dimension and the output waveguide height dimension, the output waveguide section having a width dimension equal to the width dimension of the reduced height waveguide section;

a probe extendable into the waveguide through the slot;

a vertical drive apparatus for selectively positioning the probe at positions at variable depths within the waveguide to vary the reflection coefficient, said vertical drive apparatus including a first electric motor drive;

a horizontal drive apparatus for selectively positioning the probe within a tuning range of movement along the slot to vary the phase of the reflections from the probe, said horizontal drive apparatus including a second electric motor drive;

wherein the reduced height waveguide provides higher cut-off frequencies for first higher order modes excited in the waveguide due to discontinuities, thereby widening a bandwidth of the tuner.

29. The tuner of claim 28 wherein said probe comprises a dielectric probe structure having a conductive tip region, the conductive tip region for disposition into the waveguide through the slot, wherein the dielectric probe structure suppresses propagation of coaxial mode electromagnetic energy from the waveguide through the slot.

30. The tuner of claim 28 wherein the dielectric probe structure comprises a flat vane structure fabricated of a low loss dielectric material.

31. The tuner of claim 30 wherein the conductive tip region is defined by first and second layers of conductive material formed on opposite sides of said flat vane structure.

32. The tuner of claim 28 wherein a choke filter is defined in said slot to suppress electromagnetic energy leakage through the slot.

33. The tuner of claim 32 wherein said tuner operates over a predetermined operating frequency band, and said choke filter comprises a plurality of choke elements each defined to operate over a given frequency sub-band comprising the operating frequency band.

34. The tuner of claim 28 wherein the waveguide is a rectangular waveguide including a broad wall, and the slot is formed in the broad wall.

35. The tuner of claim 28 wherein the tuner is adapted for an operating frequency band covering 75 GHz to 110 GHz.

* * * * *